United States Patent
Hwang

(10) Patent No.: US 9,287,460 B2
(45) Date of Patent: Mar. 15, 2016

(54) LIGHT EMITTING DEVICE, LIGHT EMITTING DEVICE PACKAGE AND LIGHTING SYSTEM INCLUDING THE SAME

(75) Inventor: Sung Min Hwang, Anyang-si (KR)

(73) Assignee: LG INNOTEK CO., LTD., Seoul (KR)

( * ) Notice: Subject to any disclaimer, the term of this patent is extended or adjusted under 35 U.S.C. 154(b) by 214 days.

(21) Appl. No.: 12/878,717

(22) Filed: Sep. 9, 2010

(65) Prior Publication Data

US 2011/0057223 A1  Mar. 10, 2011

(30) Foreign Application Priority Data

Sep. 10, 2009 (KR) .................. 10-2009-0085317

(51) Int. Cl.
H01L 33/38 (2010.01)
H01L 33/40 (2010.01)
H01L 33/20 (2010.01)
H01L 33/46 (2010.01)

(52) U.S. Cl.
CPC ............ *H01L 33/405* (2013.01); *H01L 33/382* (2013.01); *H01L 33/20* (2013.01); *H01L 33/38* (2013.01); *H01L 33/46* (2013.01); *H01L 2224/48091* (2013.01)

(58) Field of Classification Search
CPC ...... H01L 33/382; H01L 33/38; H01L 33/405
USPC .................................. 257/98, 99
See application file for complete search history.

(56) References Cited

U.S. PATENT DOCUMENTS

| 2005/0056855 A1 | 3/2005 | Lin et al. | |
| 2006/0060880 A1 | 3/2006 | Lee et al. | |
| 2006/0145164 A1* | 7/2006 | Illek et al. | 257/79 |
| 2006/0246617 A1 | 11/2006 | Lee et al. | |
| 2007/0114550 A1 | 5/2007 | Kato et al. | |
| 2007/0194333 A1* | 8/2007 | Son | 257/88 |
| 2008/0237622 A1* | 10/2008 | Choi et al. | 257/98 |
| 2009/0267096 A1* | 10/2009 | Kim | 257/98 |
| 2010/0213481 A1 | 8/2010 | Hwang | |
| 2010/0283070 A1* | 11/2010 | Kim et al. | 257/98 |
| 2010/0314642 A1 | 12/2010 | Kudo et al. | |
| 2011/0266568 A1* | 11/2011 | Aldaz et al. | 257/98 |

FOREIGN PATENT DOCUMENTS

| CN | 1855561 A | 11/2006 |
| CN | 101877379 A | 11/2010 |
| EP | 2 224 503 A1 | 9/2010 |
| JP | 4-63478 A | 2/1992 |
| JP | 7-106631 A | 4/1995 |
| JP | 2008-199004 A | 8/2008 |
| KR | 10-2006-0062715 A | 6/2006 |
| KR | 10-2008-0075368 A | 8/2008 |
| KR | 10-2009-0010623 A | 1/2009 |
| WO | WO 2008/047923 A1 | 4/2008 |
| WO | WO 2008047923 A1 * | 4/2008 |

* cited by examiner

*Primary Examiner* — Yu Chen

(74) *Attorney, Agent, or Firm* — Birch, Stewart, Kolasch & Birch, LLP

(57) ABSTRACT

Embodiments relate to a light emitting device, a light emitting device package, and a lighting system including the same. The light emitting device includes a light emitting structure, a second electrode under the light emitting structure and an insulating layer disposed on the at least one of the protrusions. The second electrode includes a bottom member and at least one of protrusions on the bottom member that penetrates the second conductive type semiconductor layer and the active layer. The at least one of the protrusions includes an upper portion and a lower portion having different size.

11 Claims, 9 Drawing Sheets

LIGHT EMITTING DEVICE, LIGHT EMITTING DEVICE PACKAGE AND LIGHTING SYSTEM INCLUDING THE SAME

CROSS-REFERENCE TO RELATED APPLICATIONS

This application claims priority under 35 U.S.C. §119 to Korean Patent Application No. 10-2009-0085317 filed Sep. 9, 2009, which is hereby incorporated by reference.

BACKGROUND

Embodiments relate to a light emitting device, a light emitting device package, and a lighting system using the same.

A light emitting device (LED) may be implemented by a p-n junction diode, which has the characteristic converting an electrical energy to a light energy, and may be formed by combining a Group III element and a Group V element of the periodic table. The LED may implement various colors by adjusting the composition ratio of a compound semiconductor.

When a forward bias voltage is applied to a p-n junction diode, an electron of an n-type layer is recombined with a hole of a p-type layer to emit an energy corresponding to an energy gap between a conduction band and a valence band. The energy is mainly emitted in the form of heat or light. When the energy is emitted in the form of light, the p-n junction diode becomes an LED.

For example, due to high thermal stability and wide band gap energy, a nitride semiconductor has been an object of high interest in the field of developing optical devices and high power electronic devices. In particular, blue LED, green LED, UV LED, etc. using a nitride semiconductor have been commercialized and are being widely used.

In a related art vertical type LED, an n-type electrode and a p-type electrode are formed at an upper portion and a lower portion of the vertical type LED, respectively, for current injection. At this time, light emitted from a layer below the n-type electrode is absorbed into or reflected by the n-type electrode, and thus light emitting efficiency may decrease. Also, the light reflected by the n-type electrode is reabsorbed, and thus heat may be generated.

Further, according to the related art, the lifetime and reliability of the LED may be lowered due to current crowding.

BRIEF SUMMARY

Embodiments provide a light emitting device, a light emitting device package, and a lighting system including the same that can enhance light extraction efficiency as well as current spreading efficiency.

In one embodiment, a light emitting device comprises: a light emitting structure including a first conductive type semiconductor layer, an active layer under the first conductive type semiconductor layer, and a second conductive type semiconductor layer under the active layer; a second electrode under the light emitting structure including a bottom member and at least one of protrusions on the bottom member that penetrates the second conductive type semiconductor layer and the active layer; and an insulating layer disposed on the at least one of the protrusions, wherein the at least one of the protrusions comprises an upper portion and a lower portion having different size.

In another embodiment, a light emitting device package comprises: a package body; the above light emitting device over the package body; and a third electrode layer formed in the package body and electrically connected to the light emitting device.

In a further embodiment, a lighting system comprises a light emitting module part provided with the above light emitting device package.

DETAILED DESCRIPTION OF THE EMBODIMENTS

Hereinafter, a light emitting device, a light emitting device package, and a lighting system including the same according to the embodiments of the present disclosure will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under the other layer, and one or more intervening layers may also be present. In addition, it will also be understood that when a layer is referred to as being 'between' two layers, it can be the only layer between the two layers, or one or more intervening layers may also be present.

Embodiment

Figure 1:
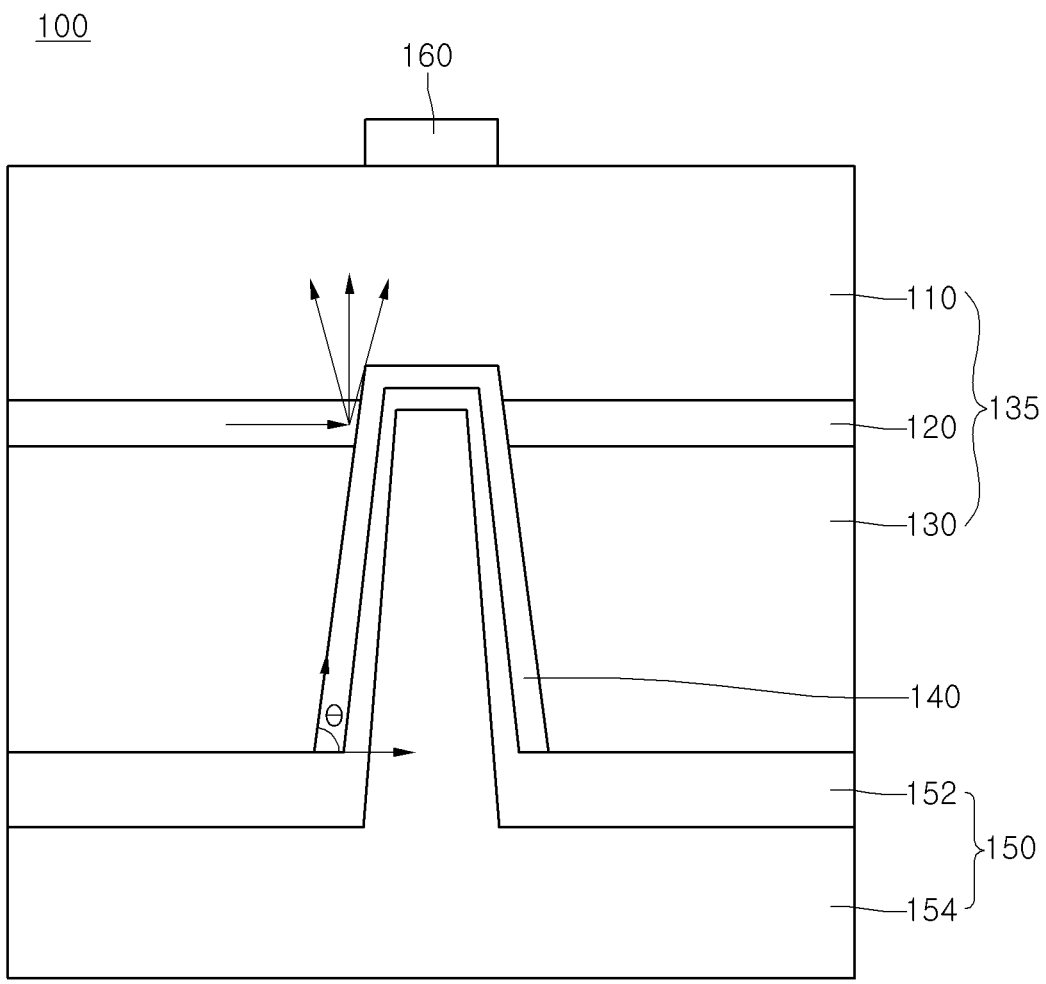
FIG. 1 is a cross-sectional view of a light emitting device according to a first embodiment.

FIG. 1 is a cross-sectional view of a light emitting device 100 according to a first embodiment.

The light emitting device (LED) 100 according to an embodiment may include: a light emitting structure including a second conductive type semiconductor layer 130, an active layer 120 and a first conductive type semiconductor layer 110; an insulating layer 140 formed on a cavity C defined by removing some of the light emitting structure; and a second electrode 150 over the second conductive type semiconductor layer 130. An angle between a top surface of a bottom member 154 and a surface of the insulating layer 140 which is disposed on the side surface of the at least one protrusion is equal to an angle between a top surface of the active layer 120 and the surface of the insulating layer 140.

By the LED according to the embodiment, since current flow may be efficiently controlled, light extraction efficiency can be increased.

Also, according to the embodiment, current spreading can enhance the reliability of the LED.

Further, according to the embodiment, since a reflective slope is formed, light extraction efficiency and light output power can be enhanced.

Hereinafter, a method for manufacturing an LED according to a first embodiment will be described with reference to FIGS. 2 through 5.

Figure 2:
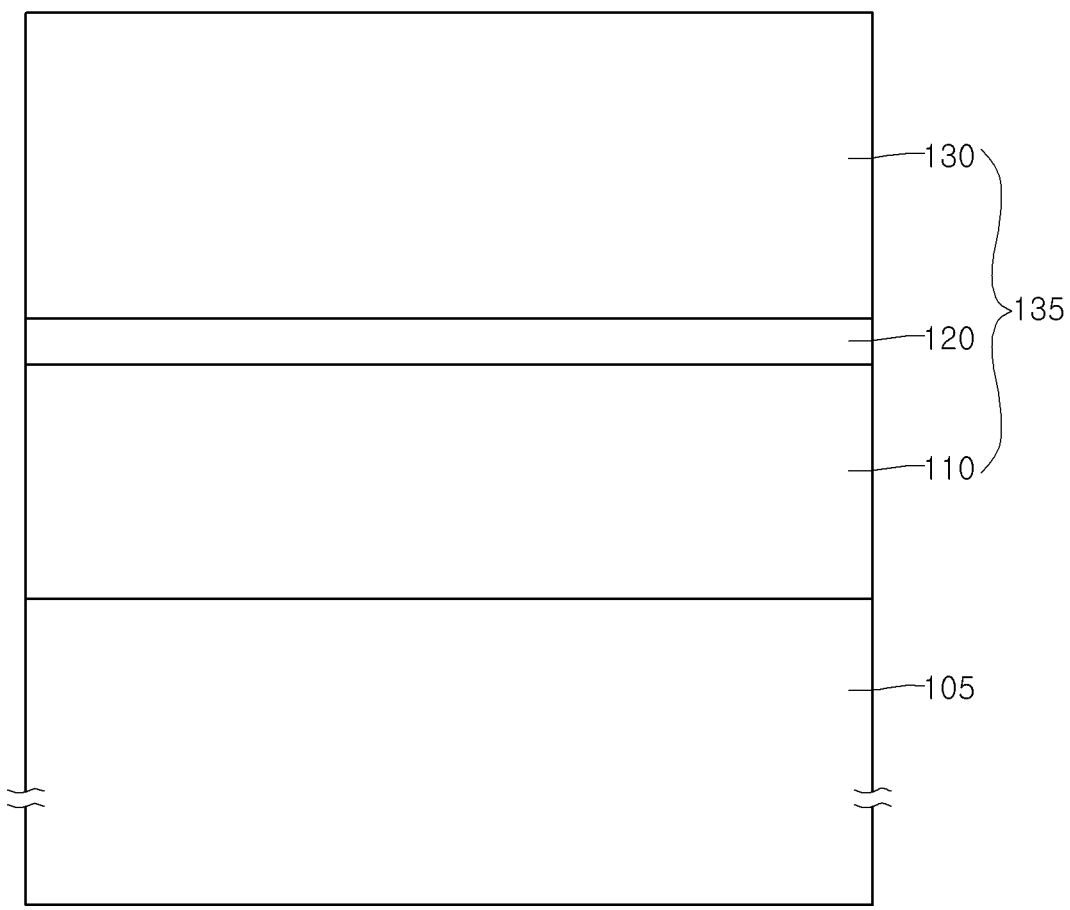
FIGS. 2 through 5 are cross-sectional views illustrating a method for manufacturing a light emitting device according to a second embodiment.

First, as shown in FIG. 2, a first substrate 105 is prepared. The first substrate 105 may include a conductive substrate or an insulating substrate. For example, the first substrate 105 may be at least one of sapphire ($Al_2O_3$), SiC, Si, GaAs, GaN, ZnO, Si, GaP, InP, Ge and $Ga_2O_3$ substrates. While an irregular structure may be formed at an upper surface of the first substrate 105, the present disclosure is not limited thereto. A wet etching may be performed with respect to the first substrate 105 to remove an impurity of a surface of the first substrate 105.

Thereafter, a light emitting structure 135 including a first conductive type semiconductor layer 110, an active layer 120 and a second conductive type semiconductor layer 130 may be formed over the first substrate 101.

A buffer layer (not shown) may be formed over the first substrate 105. The buffer layer may buffer a lattice mismatch between the materials constituting the light emitting structure 135 and the first substrate 105, and the buffer layer may be formed of a III-V compound semiconductor, for example, at least one of GaN, InN, AlN, InGaN, AlGaN, InAlGaN, and AlInN. An undoped semiconductor layer (not shown) may be formed over the buffer layer, but the present disclosure is not limited thereto.

The first conductive type semiconductor layer 110 may be implemented by a III-V compound semiconductor doped with a first conductive type dopant. In the case where the first conductive type semiconductor layer 110 is an N-type semiconductor layer, the first conductive type dopant is an N-type dopant and may include Si, Ge, Sn, Se, and/or Te as the N-type dopant, but the present disclosure is not limited thereto.

The first conductive type semiconductor layer 110 may include a semiconductor material having a compositional formula of $In_xAl_yGa_{1-x-y}N$ ($0 \leq x \leq 1$, $0 \leq y \leq 1$, $0 \leq x+y \leq 1$).

The first conductive type semiconductor layer 110 may be an N-type GaN layer, which is formed by using a chemical vapor deposition (CVD), a molecular beam epitaxy (MBE), a sputtering, a hydride vapor phase epitaxy (HVPE), or the like. Also, the first conductive type semiconductor layer 110 may be formed by injecting trimethyl gallium (TMGa) gas, ammonia (NH3) gas, nitrogen (N2) gas, and silane ($SiH_4$) gas including [0033] an n-type impurity such as silicon (Si).

The active layer 120 is a layer emitting light having an energy, which is determined by an inherent energy band of a material constituting the active layer (i.e., light emitting layer) when an electron injected through the first conductive type semiconductor layer 110 meets with and is recombined with a hole injected through the second conductive type semiconductor layer 130.

The active layer 120 may be formed in at least one of a single quantum well structure, a multi quantum well (MQW) structure, a quantum-wire structure, and a quantum dot structure. For example, the active layer 120 may be formed in the MQW structure by injecting trimethyl gallium (TMGa) gas, ammonia ($NH_3$) gas, nitrogen ($N_2$) gas, and trimethyl indium (TMIn) gas, but the present disclosure is not limited thereto.

Well layer/barrier layer of the active layer 120 may be formed in at least one pair structure of InGaN/GaN, InGaN/InGaN, AlGaN/GaN, InAlGaN/GaN, GaAs/AlGaAs(InGaAs), GaP/AlGaP(InGaP), but the present disclosure is not limited thereto. The well layer may be formed of a material having a band gap lower than a band gap of the barrier layer.

A conductive clad layer may be formed over or/and below the active layer 120. The conductive clad layer may be formed of an AlGaN-based semiconductor, and may have a band gap higher than the active layer 120.

The second conductive type semiconductor layer 130 may include III-V compound semiconductor, for example, semiconductor material having a compositional formula of $In_xAl_yGa_{1-x-y}N$ ($0 \leq x \leq 1$, $0 \leq y \leq 1$, $0 x+y \leq 1$). In the case where the second conductive type semiconductor layer 130 is a P-type semiconductor layer, the second conductive type dopant may include Mg, Zn, Ca, Sr, Ba, or the like as a P-type dopant. The second conductive type semiconductor layer 130 may be a P-type GaN layer, which is formed by injecting trimethyl gallium (TMGa) gas, ammonia ($NH_3$) gas, nitrogen ($N_2$) gas, and biscetyl cyclo pentadienyl magnesium (($EtCp_2Mg$){Mg($C_2H_5C_5H_4)_2$}) including a P-type impurity such as Mg into a chamber, but the present disclosure is not limited thereto.

In the embodiment, the first conductive type semiconductor layer 110 may be implemented by an N-type semiconductor layer and the second conductive type semiconductor layer 130 may be implemented by a P-type semiconductor layer, but the present disclosure is not limited thereto. Alternatively, a semiconductor layer having an opposite conductive type to the second conductive type, for example, an N-type semiconductor layer (not shown) may be formed over the second semiconductor layer 130. Accordingly, the light emitting structure 135 may be implemented in at least one of an N-P junction structure, a P-N junction structure, an N-P-N junction structure, and a P-N-P junction structure.

Figure 3:
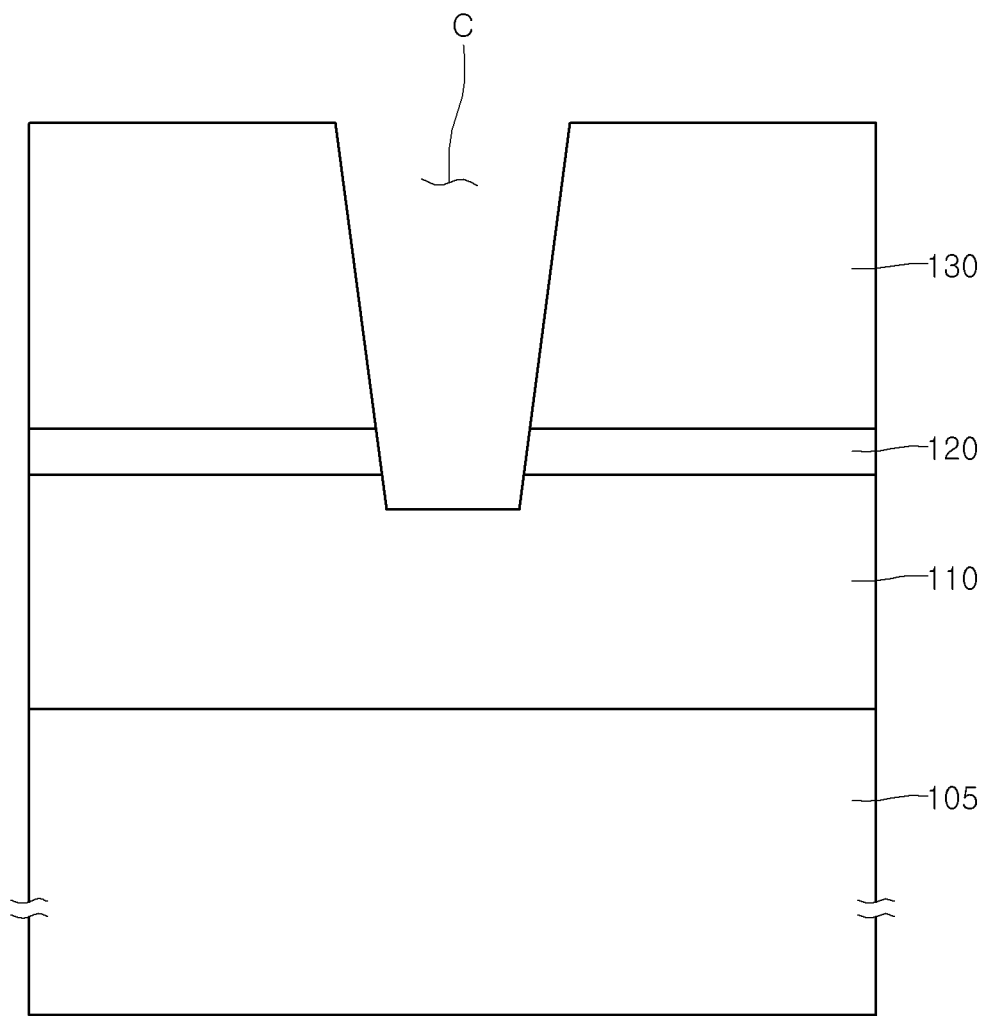

Next, as shown in FIG. 3, the second conductive type semiconductor layer 130, the active layer 120 and the first conductive type semiconductor layer 110 are partially removed to form a cavity C. The cavity C may include meanings such as recess, groove, ditch, trench, and the like.

For example, to form the cavity C, an etching may be performed starting from the second conductive type semiconductor layer 130 of a portion positioned vertically below a first electrode 160 to be formed later until a portion of the first conductive type semiconductor layer 110 is exposed. The etching for forming the cavity C may be performed by a dry or wet etching.

In the embodiment, the cavity C may be formed by partially and sequentially etching the second conductive type semiconductor layer 130 and the active layer 120, or further etching a portion of the first conductive type semiconductor layer 110.

According to the embodiment, since current is not smoothly supplied to the cavity forming region, light emitting is not generated over the cavity C and thus absorption of light by the first electrode 160 positioned over the cavity can be minimized.

Also, in the embodiment, the width of the cavity C may be smaller in a portion near the active layer 120 than in a portion far from the active layer 120. Accordingly, light emitted by a light emitting layer, etc. to be formed later may be efficiently reflected and thus extracted to an outside.

Also, in the embodiment, since the insulating layer 140 is formed over the cavity C, current is not smoothly supplied to the cavity forming region, so that light is not generated from the active layer 120 over the cavity C and thus absorption of light by the first electrode 160 positioned over the cavity C can be minimized.

Figure 4:
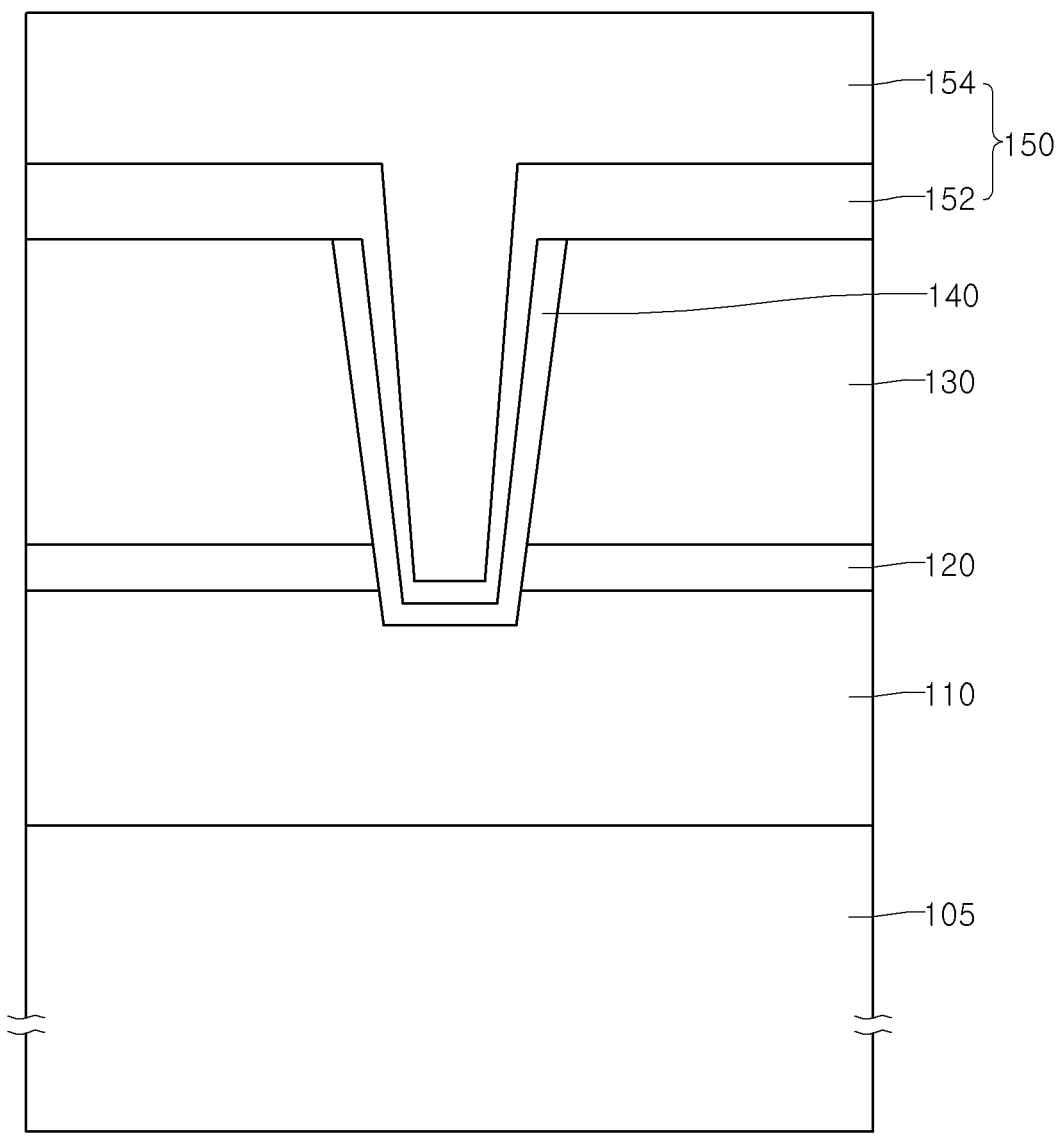

Next, as shown in FIG. 4, the insulating layer 140 is formed on the cavity C. For example, the insulating layer 140 may include a dielectric layer, an amorphous layer, or the like.

For example, the dielectric layer 140, such as a nitride layer (e.g., SiN), or an oxide layer (e.g., $SiO_2$) may be formed over the cavity C. Meanwhile, in the embodiment, since the insulating layer 140 includes a transparent insulating layer, light emitted from the active layer 120 transmits the insulating layer 140 and then is reflected by a reflective layer 152 of a second electrode 150 to be formed later, thereby capable of enhancing light extraction efficiency.

Meanwhile, according to the embodiment, in the case where the insulating layer 140 is higher in the reflectivity than in the transmittance, the insulating layer 140 may play a role in reflecting the light emitted from the active layer 120.

Also, in the embodiment, proton having a high kinetic energy may be injected into a surface of the cavity C, so that the proton collides the crystal lattice to break the single crystal status, thereby capable of forming an amorphous layer having a high electrical resistance.

In the embodiment, the insulating layer 140 may be formed partially on a bottom surface of the second conductive type semiconductor layer 130 as well as on a side surface and a top surface, so that the insulating layer can be maintained rigidly.

Thereafter, a second electrode 150 is formed on the second conductive type semiconductor layer 130 and the insulating layer 140.

The second electrode 150 may include an ohmic layer (not shown), a reflective layer 152, a junction layer (not shown), a conductive substrate 154, etc. For example, the second electrode 150 may be formed of at least one of titanium (Ti), nickel (Ni), aluminum (Al), platinum (Pt), gold (Au), tungsten (W), or a semiconductor substrate doped with an impurity. For example, the second electrode 150 may include an ohmic layer, and the ohmic layer (not shown) may be formed by multi-stacking a single metal layer, a metal alloy layer, and/or a metal oxide layer such that hole injection is efficiently performed. For example, the ohmic layer may be formed including at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but the present disclosure is not limited thereto.

Also, the second electrode 150 may include the reflective layer 152 or a junction layer (not shown). For example, in the case where the second electrode 150 includes the reflective layer 152, the second electrode 150 may be formed of a metal layer including aluminum (Al), silver (Ag), or an alloy including Al or Ag. Al, Ag, or the like may effectively reflect light generated from the active layer to greatly improve light extraction efficiency of the LED.

In the embodiment, the reflective layer 152 may be partially formed in the cavity C. For example, the reflective layer 152 may be formed on a surface of the cavity C without completely filling the cavity C. Therefore, according to the embodiment, the thickness of the reflective layer 152 may be determined in consideration of the thickness of the reflective layer 152 capable of obtaining an optimum reflective rate.

Figure 6:
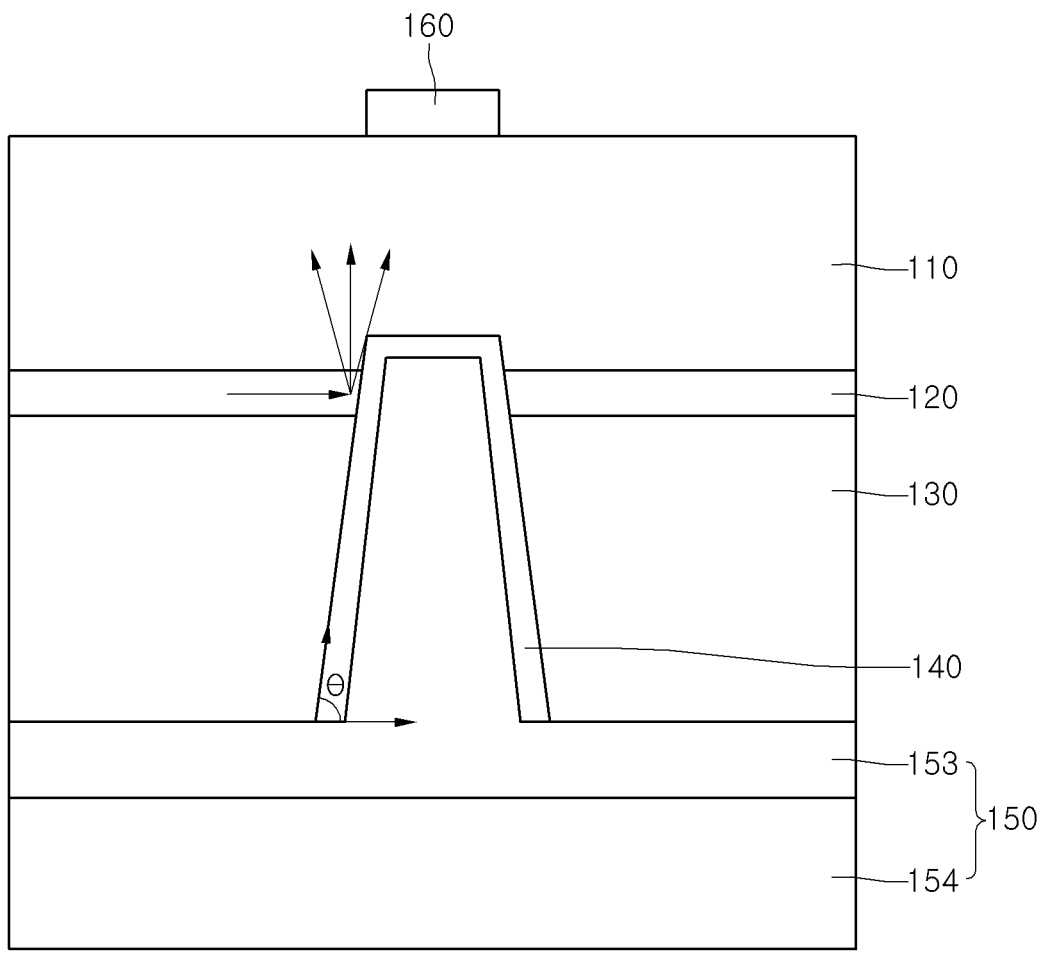
FIG. 6 is a cross-sectional view of a light emitting device according to a second embodiment.

Meanwhile, FIG. 6 is a cross-sectional view of an LED 102 according to a second embodiment. In the LED 102, a reflective layer 153 may be formed in a structure completely filling a cavity. In this case, the reflective layer 153 may be easily bonded to a conductive substrate 154 to be formed later.

According to the embodiment, light emitted from a light emitting layer transmits an insulating layer 140 and then is reflected by the reflective layer 153 of the second electrode 150, thereby capable of light extraction efficiency. Also, according to the embodiment, the in the case where the cavity C is formed in a structure that the width of the cavity C increases as it goes from an upper portion to a lower portion of the cavity C, the light reflected by the reflective layer 153 may be efficiently reflected in an upward direction of the light emitting structure, so that light extraction efficiency can be enhanced.

Also, in the embodiment, in the case where the second electrode layer 150 includes a junction layer, the reflective layer functions as the junction layer, or the junction layer may be formed using nickel (Ni), gold (Au), or the like.

Figure 5:
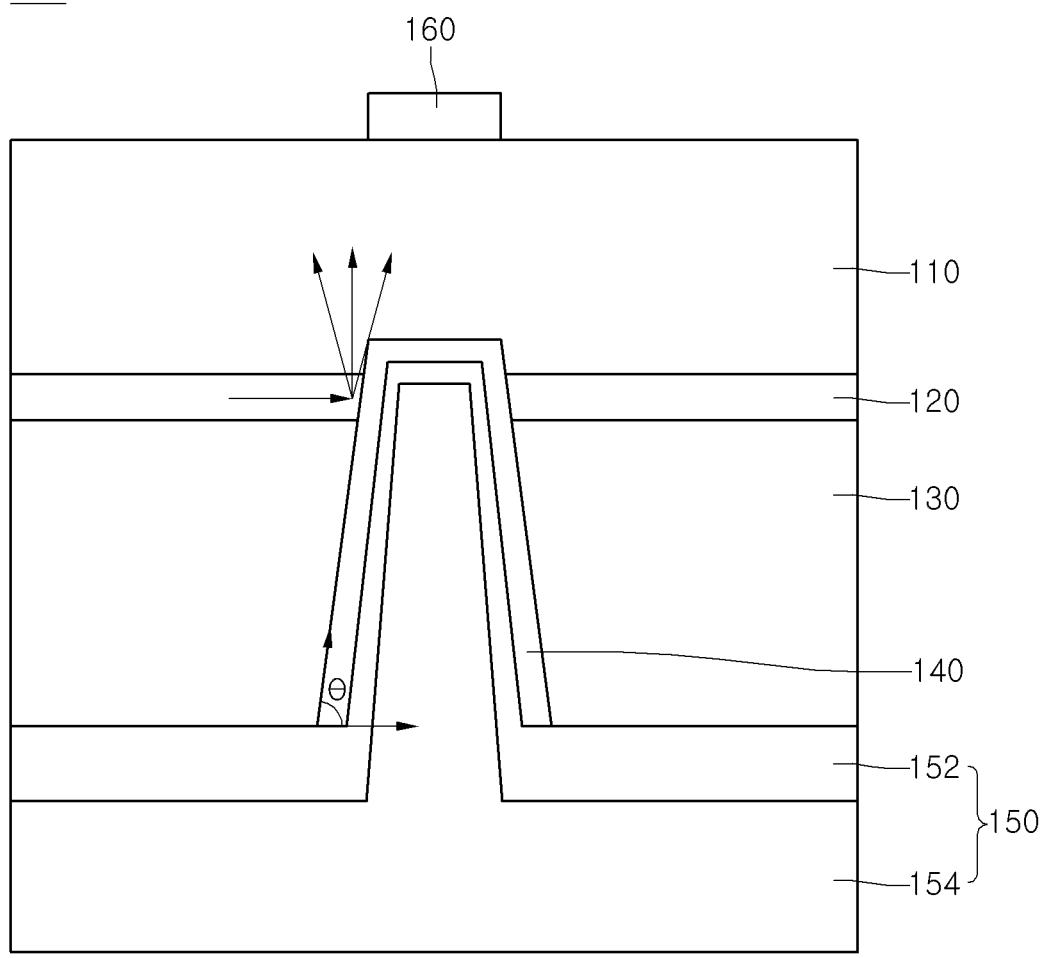

Thereafter, as shown in FIG. 5 or 6, a conductive substrate 154 may be formed on the reflective layer 153. For example, the conductive substrate 154 may selectively include copper (Cu), gold (Au), Cu alloy, nickel (Ni), Cu—W, a carrier wafer (e.g., GaN, Si, Ge, GaAs, ZnO, SiGe, SiC, etc.), or the like.

The conductive substrate 154 may be formed by using an electrochemical metal deposition method or a bonding method using a eutectic metal.

Next, as shown in FIG. 5, the first substrate 105 may be removed. The first substrate 105 may be removed by lifting the first substrate off using a high power laser, or by using a chemical etching method. Also, the first substrate 105 may be removed by physically grinding the first substrate 105.

Thereafter, a first electrode 160 may be formed over the first conductive semiconductor layer 110 exposed by removing the first substrate 105. The first electrode 160 may be formed over the first conductive type semiconductor layer 110 such that the first electrode 160 overlaps the cavity C, spatially.

In the embodiment, since the cavity region C positioned vertically below the first electrode 160 does not have the active layer 120, generation of light due to the recombination of carriers (i.e., electron and hole) does not Occur.

In the embodiment, since the cavity C that is an etched region is covered with the insulating layer 140, current does not flow but flows through regions other than the cavity C. That is, since the cavity is covered with the insulating layer 140, the cavity functions as a current blocking layer (CBL). Therefore, efficient current flow is generated, so that the reliability can be enhanced and absorption of light by the first electrode can be minimized, thereby increasing light quantity.

According to the embodiment, light extraction efficiency and current spreading can be enhanced at the same time.

Figure 7:
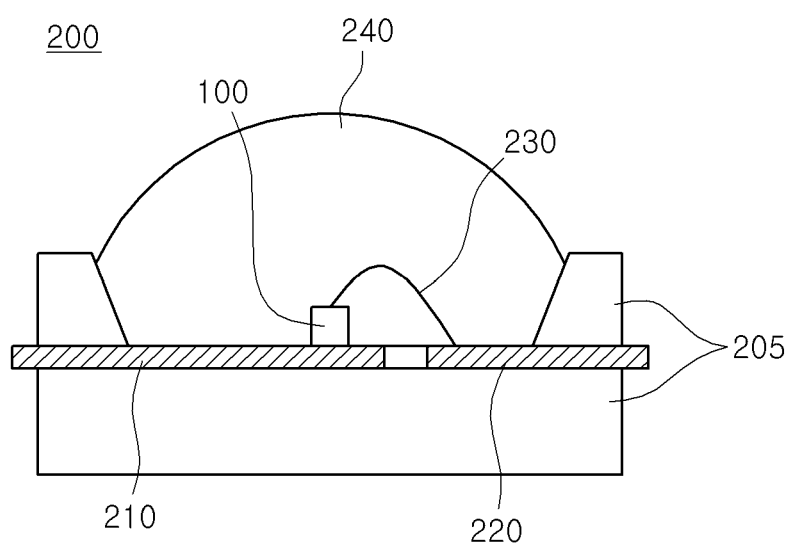
FIG. 7 is a cross-sectional view of a light emitting device package according to an embodiment.

FIG. 7 is a cross-sectional view of a light emitting device package 200 provided with a light emitting device according to embodiments.

Referring to FIG. 7, the light emitting device package 200 according to the embodiment includes a body 205, third and fourth electrode layers 210 and 220 mounted over the body 205, an LED 100 mounted over the body 205 and electrically connected to the third and fourth electrode layers 210 and 220, and a molding member 240 enclosing the LED 100.

The body 205 may be formed including a silicon material, a synthetic resin material, or a metal material, and may have an inclination surface around the LED 100.

The third electrode layer 210 and the fourth electrode layer 220 are electrically separated, and function to supply power to the LED 100. Also, the third and fourth electrode layers 210 and 220 may reflect light generated from the LED 100 to thus increase light efficiency, and may emit heat generated from the LED 100 to an outside.

The LED 100 may be a vertical type LED shown in FIG. 1, but the present disclosure is not limited thereof. For example, a horizontal type LED may be applied to the light emitting device package 200.

The LED 100 may be mounted over the body or over the third electrode layer 210 or the fourth electrode layer 220.

The LED 100 may be electrically connected to the third electrode layer 210 and/or the fourth electrode layer 220 through a wire 230. While the current embodiment exemplarily shows that the LED 100 is a vertical type LED and is electrically connected using one wire 230, the present disclosure is not limited thereto.

The molding member 240 may enclose and protect the LED 100. Also, a fluorescent material may be included in the molding member 240 to change the wavelength of light emitted from the LED 100.

The light emitting device package according to the embodiment may be applied to a lighting system. The lighting system may include a lighting unit shown in FIG. 8, and a backlight unit shown in FIG. 9, and may further a traffic light, a vehicle headlight, and a sign.

Figure 8:
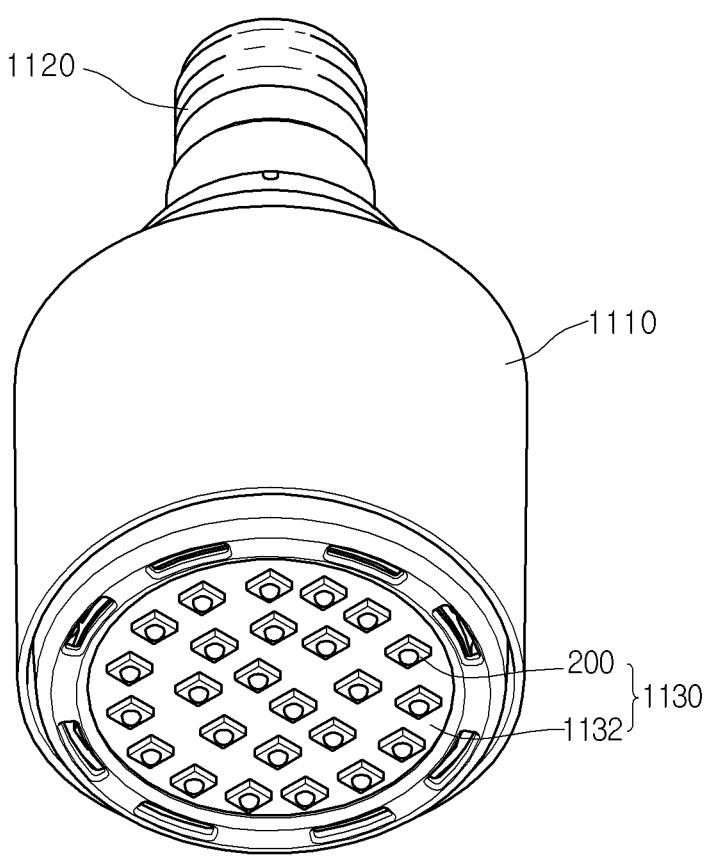
FIG. 8 is a perspective view of a lighting unit according to an embodiment.

FIG. 8 is a perspective view of a lighting unit 1100 according to an embodiment.

Referring to FIG. 8, the lighting unit 1100 may include a case body 1110, a light emitting module part 1130 equipped in the case body 1110, and a connection terminal 1120 equipped in the case body 1110 and supplied with an electric power from an external power supply.

The case body 1110 may be preferably formed of a material having good heat shielding characteristics, for example, a metal material or a resin material.

The light emitting module part 1130 may include a substrate 1132, and at least one light emitting device package 200 mounted on the substrate 1132.

The substrate 1132 may be an insulator substrate on which a circuit pattern is printed, and may include, for example, a general printed circuit board (PCB), a metal core PCB, a flexible PCB, a ceramic PCB, etc.

Also, the substrate 1132 may be formed of a material to efficiently reflect light, and a surface thereof may be formed in a color capable of efficiently reflecting light, for example, white color, or silver color.

The at least one light emitting device packages 200 may be mounted over the substrate 1132. Each of the light emitting device packages 200 may include at least one light emitting diode (LED) 100. The light emitting diode 100 may include a color LED emitting red, green, blue or white light, and a UV LED emitting ultraviolet (UV).

The light emitting module part 1130 may have a combination of several LEDs so as to obtain desired color and luminance. For example, the light emitting module part 1130 may have a combination of a white LED, a red LED, and a green LED so as to obtain a high color rendering index (CRI).

The connection terminal 1120 may be electrically connected to the light emitting module part 1130 to supply power. As shown in FIG. 8, the connection terminal 1120 may be screwed and coupled to an external power in a socket type, but the present disclosure is not limited thereto. For example, the connection terminal 1120 may be made in a pin type and inserted into an external power, or may be connected to the external power through a power line.

Figure 9:
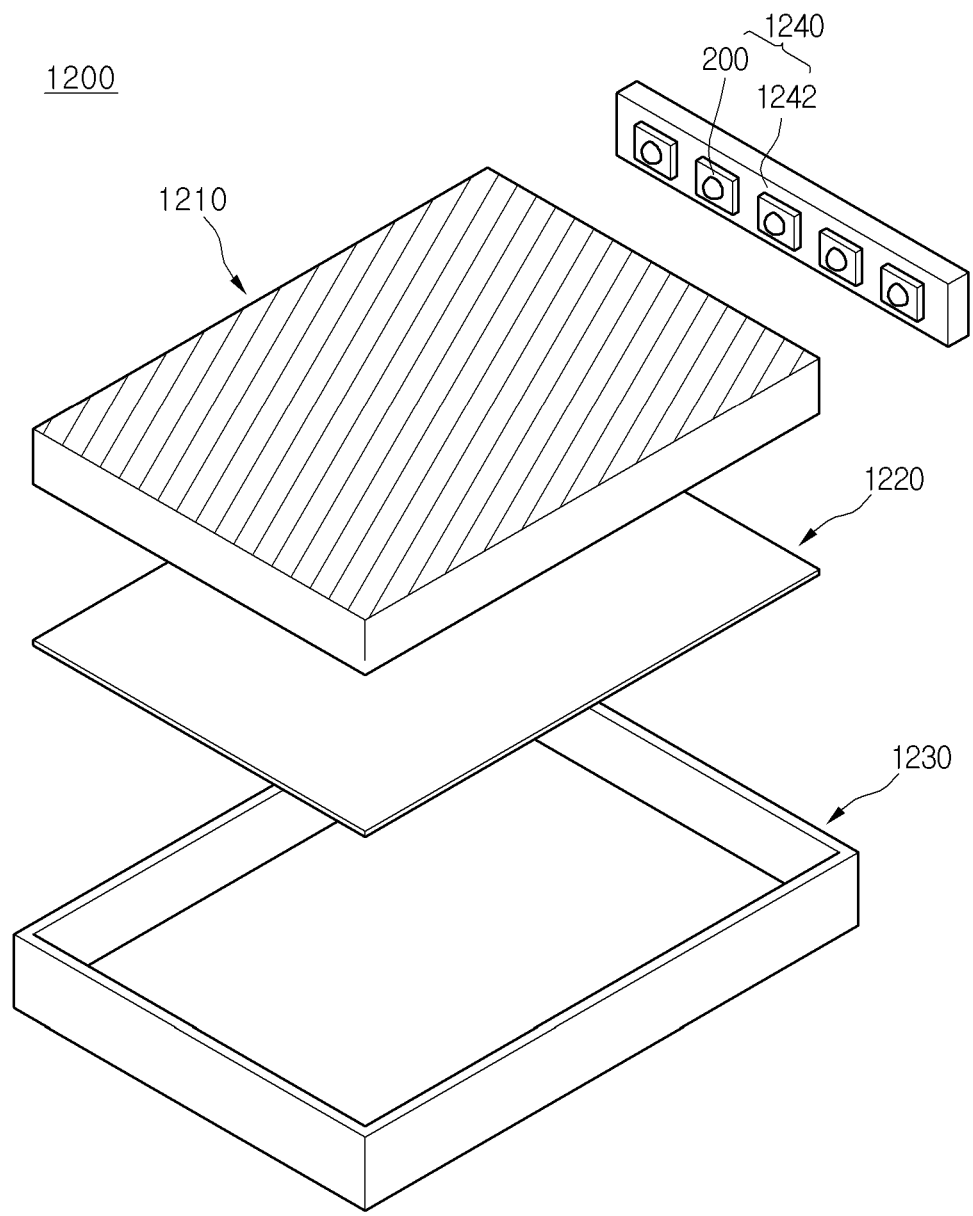
FIG. 9 is a disassembled perspective view of a backlight unit according to an embodiment.

FIG. 9 is a disassembled perspective view of a backlight unit 1200 according to an embodiment.

The backlight unit 1200 according to the embodiment may include a light guide panel 1210, a light emitting module part 1240 supplying light to the light guide panel 1210, a reflective member 1220 below the light guide panel 1210, and a bottom cover 1230 receiving the light guide panel 1210, the light emitting module part 1240, and the reflective member 1220, but the present disclosure is not limited thereto.

The light guide panel 1210 functions to transform linear light to planar light by diffusing the linear light. The light guide panel may include one of acryl-series resin such as polymethyl metaacrylate (PMMA), polyethylene terephthlate (PET), poly carbonate (PC), COC, and polyethylene naphthalate resin.

The light emitting module part 1240 provides light to at least a side surface of the light guide panel 1210, and finally acts as a light source of a display device in which the backlight unit is equipped.

The light emitting module part 1240 may contact the light guide panel 1210, but the present disclosure is not limited thereto. Concretely, the light emitting module part 1240 includes a substrate 1242, and a plurality of light emitting device packages 200 mounted on the substrate 1242. The substrate 1242 may contact the light guide panel 1210, but the present disclosure is not limited thereto.

The substrate 1242 may be a PCB including a circuit pattern (not shown). The substrate 1242 may include a metal core PCB (MCPCB), a flexible PCB (FPCB), etc. as well as the general PCB, but the present disclosure is not limited thereto.

The plurality of light emitting device packages 200 may be mounted over the substrate 1242 such that light emitting surfaces of the plurality of light emitting device packages 200 are spaced apart by a predetermined distance from the light guide panel 1210.

The reflective member 1220 may be provided below the light guide panel 1210. The reflective member 1220 reflects light incident from a bottom surface of the light guide panel to allow the reflected light to be directed toward an upper direction, thereby capable of enhancing brightness of the backlight unit. The reflective member 1220 may be formed of, for example, PET, PC, PVC resin, or the like, but the present disclosure is not limited thereto.

The bottom cover 1230 may receive the light guide panel 1210, the light emitting module part 1240, the reflective member 1220, and the like. For this purpose, the bottom cover 1230 may be formed in a box shape a top surface of which is opened, but the present disclosure is not limited thereto.

The bottom cover 1230 may be formed of a metal material or resin material, and may be manufactured by using a process such as a press molding or an injection molding.

Any reference in this specification to 'one embodiment,' 'an embodiment,' 'example embodiment,' etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure including a first conductive type semiconductor layer, an active layer under the first conductive type semiconductor layer, and a second conductive type semiconductor layer under the active layer;
a first electrode on an upper side of the light emitting structure;
a second electrode on an underside of the light emitting structure;
at least one cavity penetrating the second conductive type semiconductor layer and the active layer; and
an insulating layer disposed on the at least one cavity,
wherein the second electrode comprises:
a conductive layer; and
a reflective layer disposed between the insulating layer and the conductive layer,
wherein the insulating layer and the reflective layer fully fill the cavity, and wherein the reflective layer comprises at least one protrusion in the cavity,
wherein the at least one protrusion comprises an upper portion and a lower portion having different sizes,
wherein the first electrode is vertically aligned with the at least one protrusion,
wherein a top surface of the reflective layer is higher than a top surface of the active layer in a portion vertically overlapping the first electrode, and
wherein the top surface of the reflective layer comprises a flat top surface.

2. The light emitting device of claim 1, wherein the at least one protrusion has a width which increases as it goes from the upper portion to the lower portion thereof.

3. The light emitting device of claim 1, wherein the reflective layer is disposed between the second conductive type semiconductor layer and the conductive layer.

4. The light emitting device of claim 1, wherein the insulating, layer on the at least one protrusion of the second electrode contacts the first conductive type semiconductor layer.

5. The light emitting device of claim 1, wherein the insulating layer comprises a transparent insulating layer.

6. The light emitting device of claim 1, wherein the insulating layer is disposed on a top surface and a side surface of the at least one protrusion.

7. The light emitting device of claim 6, wherein an angle between a top surface of the conductive layer and a surface of the insulating layer which is disposed on the side surface of the at least one protrusion is equal to an angle between a top surface of the active layer and the surface of the insulating layer which is disposed on the side surface of the at least one protrusion.

8. A light emitting device package comprising:
a package body;
a light emitting device of claim 1 over the package body; and
a third electrode layer formed in the package body and electrically connected to the light emitting device.

9. The light emitting device of claim 1, wherein light generated from the active layer is extracted through at least one area of an upper side of the light emitting structure.

10. The light emitting device of claim 1, wherein the reflective layer comprises a bottom portion between the conductive layer and the second conductive type semiconductor layer.

11. The light emitting device of claim 1, wherein the upper portion of the at least one protrusion comprises a flat top surface, and
a width of the at least one protrusion increases as it goes from the upper portion to the lower portion.

* * * * *